(12) United States Patent
Liu et al.

(10) Patent No.: US 9,368,627 B2
(45) Date of Patent: Jun. 14, 2016

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Ping-Chung Liu, Taipei (TW); Wei-Chiang Hung, Changhua County (TW); Hsiang-Yu Tsai, Hsinchu (TW); Kuo Hui Chang, Taoyuan County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 14/483,806

(22) Filed: Sep. 11, 2014

(65) Prior Publication Data
US 2016/0079420 A1    Mar. 17, 2016

(51) Int. Cl.
| | |
|---|---|
| *H01L 21/336* | (2006.01) |
| *H01L 29/78* | (2006.01) |
| *H01L 29/423* | (2006.01) |
| *H01L 29/66* | (2006.01) |
| *H01L 21/283* | (2006.01) |
| *H01L 21/324* | (2006.01) |
| *H01L 21/311* | (2006.01) |
| *H01L 21/302* | (2006.01) |
| *H01L 21/31* | (2006.01) |
| *H01L 21/265* | (2006.01) |
| *H01L 21/8238* | (2006.01) |

(52) U.S. Cl.
CPC .......... *H01L 29/7843* (2013.01); *H01L 21/265* (2013.01); *H01L 21/283* (2013.01); *H01L 21/302* (2013.01); *H01L 21/31* (2013.01); *H01L 21/31116* (2013.01); *H01L 21/324* (2013.01); *H01L 21/3247* (2013.01); *H01L 21/823814* (2013.01); *H01L 21/823828* (2013.01); *H01L 21/823864* (2013.01); *H01L 29/4232* (2013.01); *H01L 29/6653* (2013.01); *H01L 29/6656* (2013.01); *H01L 29/7847* (2013.01)

(58) Field of Classification Search
CPC .................................................... H01L 29/7847
See application file for complete search history.

(56) References Cited

U.S. PATENT DOCUMENTS

| | | | |
|---|---|---|---|
| 6,350,677 B1 * | 2/2002 | Ko et al. ................. | 438/630 |
| 7,785,950 B2 | 8/2010 | Fang et al. | |
| 2005/0227446 A1 * | 10/2005 | Kao et al. ............... | 438/305 |
| 2008/0081471 A1 * | 4/2008 | Press et al. ............ | 438/682 |
| 2012/0070971 A1 * | 3/2012 | Yeong et al. ........... | 438/558 |

* cited by examiner

*Primary Examiner* — Reema Patel
(74) *Attorney, Agent, or Firm* — WPAT, P.C., Intellectual Property Attorneys; Anthony King

(57) ABSTRACT

A semiconductor structure includes a semiconductor substrate; a gate stack on the semiconductor substrate; and a stress memorization technology (SMT) sidewall spacer over a sidewall of the gate stack. The gate stack includes a gate dielectric layer over the semiconductor substrate and a gate electrode over the gate dielectric layer. The SMT sidewall spacer provides a stress for a channel region beneath the gate stack.

19 Claims, 17 Drawing Sheets

SEMICONDUCTOR STRUCTURE AND MANUFACTURING METHOD THEREOF

FIELD

The present disclosure relates to a semiconductor structure, and more specifically to stress memorization technology (SMT).

BACKGROUND

A significant trend throughout integrated circuit (IC) development is the downsizing of IC components. As the size reduces, the performance requirements become more stringent. Also, as devices continue to shrink in size, the channel region continues to shrink as well. For metal-oxide-semiconductor field effect transistors (MOSFETs), increased performance requirements such as current and speed have generally been met by aggressively scaling the length of the channel region.

One technique that may improve scaling limits and device performance is to introduce strain into the channel region, which can improve electron and/or hole mobility. When applied in a longitudinal direction (i.e., in the direction of current flow), tensile stress is known to enhance electron mobility (n-type FET drive currents) while compressive stress is known to enhance hole mobility (p-type FET drive currents). The application of stresses to field effect transistors (FETs) is known to improve their performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
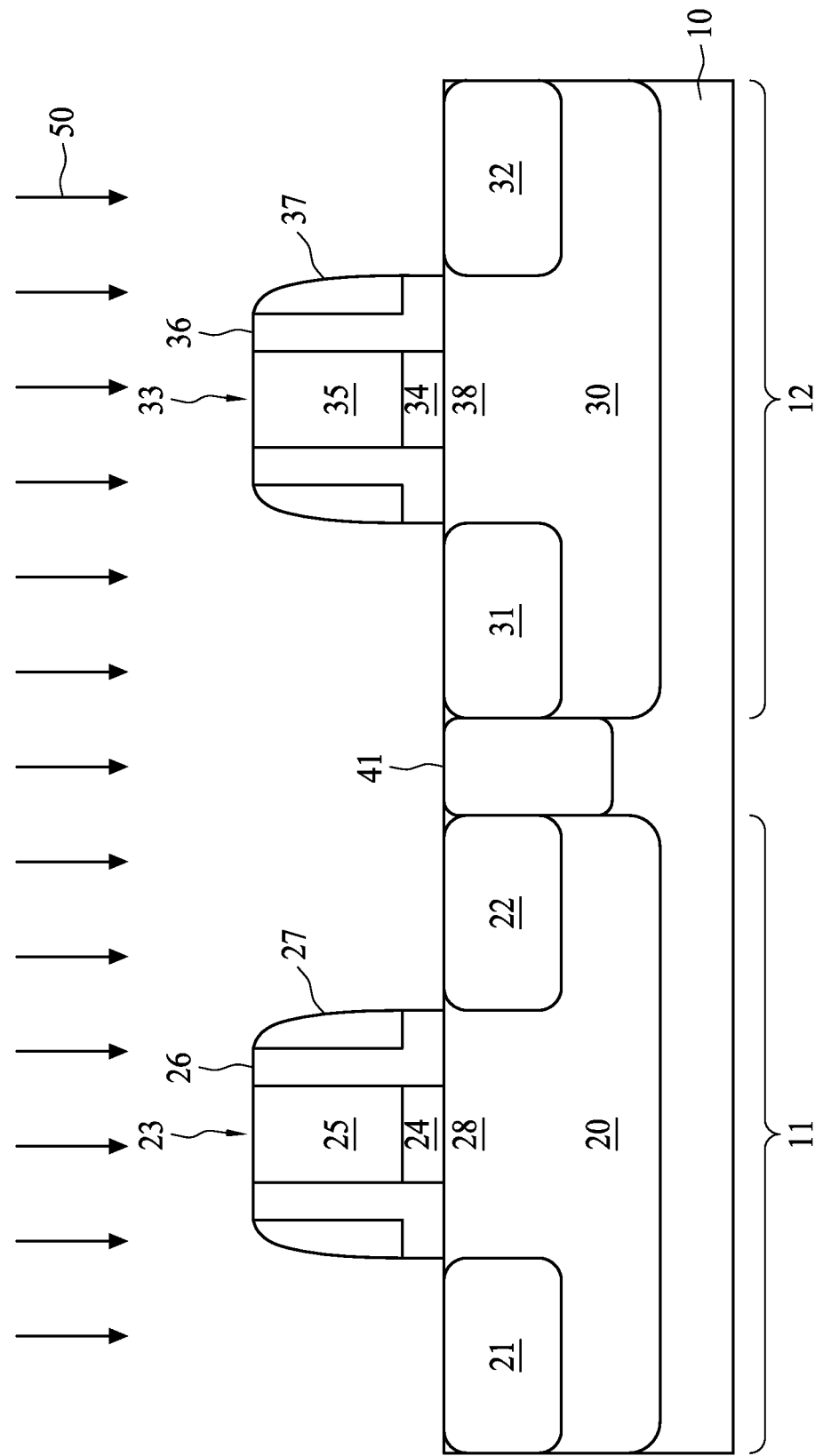
FIGS. 1A-1J are cross-sectional views illustrating a method of manufacturing a stress memorization technology (SMT) sidewall spacer in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "wafer" and "substrate," as used herein, are to be understood as including silicon, silicon-on-insulator (SOI) technology, silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor does not need to be silicon-based, but could be based on silicon-germanium, germanium, gallium arsenide or other semiconductor structures.

The term "isolation," as used herein, refers to an oxide structure or a dielectric structure for isolating devices. There are two typical formation processes, one is Local Oxidation of Silicon (LOCOS) and the other is Shallow Trench Isolation (STI).

The terms "deposition" and "deposit," as used herein, refer to operations of depositing materials on a substrate using a vapor phase of a material to be deposited, a precursor of the material, and an electrochemical reaction or sputtering/reactive sputtering. Depositions using a vapor phase of a material include any operations such as, but not limited to, chemical vapor deposition (CVD) and physical vapor deposition (PVD). Examples of vapor deposition methods include hot filament CVD, rf-CVD, laser CVD (LCVD), conformal diamond coating operations, metal-organic CVD (MOCVD), thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like. Examples of deposition using an electrochemical reaction include electroplating, electro-less plating, and the like. Other examples of deposition include pulse laser deposition (PLD) and atomic layer deposition (ALD).

There exists a continuing requirement to improve semiconductor device performances and scale down semiconductor devices. As the size reduces, the performance requirements become more stringent. A characteristic that limits scalability and device performance is electron and/or hole mobility throughout the channel region of transistors. One technique that may improve scaling limits and device performance is to introduce stress into the channel region, which can improve electron and/or hole mobility. It has been shown theoretically and confirmed experimentally that carrier mobility in the channel region of a FET can be increased or decreased significantly by mechanical stress and depending on the type of stress (e.g. tensile or compressive) and the carrier type (e.g. electron or hole). For example, the tensile stress increases electron mobility and decreases hole mobility, whereas the compressive stress increases hole mobility while decreasing electron mobility in the channel region.

A method for providing a stress into the channel region is the stress memorization technology (SMT). Regarding the process of the SMT, a source/drain region is formed adjacent to a gate stack, wherein the gate stack includes a gate electrode and a gate dielectric layer. The present disclosure provides a method and a semiconductor structure for reducing the cycles and cost of manufacturing, wherein the SMT layer is served as a main sidewall spacer. Instead of being removed, the SMT layer remaining over the channel region prevents the stress from being released during subsequent processes. Further, the remaining SMT layer also enhances the stress introduced into the channel region. With the remaining SMT layer, speed and current performance of devices can be improved.

FIGS. 1A-1E represent a method of manufacturing a stress memorization technology (SMT) sidewall spacer in accordance with some embodiments of the present disclosure. Each figure represents a stage of the method in a cross-sectional perspective view.

Referring to FIG. 1A, a semiconductor substrate 10 is provided, wherein the semiconductor substrate 10 includes a PMOS 11 and an NMOS 12. Examples of the semiconductor substrate 10 include, but are not limited to, silicon and germanium. In an embodiment, the semiconductor substrate 10 is made of a compound semiconductor, for example, silicon carbide, gallium arsenic, gallium phosphide, indium phosphide, indium arsenide, and indium antimonide. In an embodiment, the semiconductor substrate 10 is made of an alloy semiconductor, for example, SiGe, GaAsP, AlInAs, AlGaAs, GaInAs, GaInP, and GaInAsP. In an embodiment, the semiconductor substrate 10 is made of a semiconductor on insulator (SOI), which includes a doped epitaxial layer, a gradient semiconductor layer, and/or a stacked semiconductor structure with one semiconductor layer (e.g., Si) overlying another semiconductor layer (e.g., Ge) of a different type.

The PMOS 11 includes a well 20 with an n-type dopant, source/drain regions 21 and 22 with p-type dopants, a gate stack 23, a liner 26 and a dielectric layer 27, wherein the gate stack 23 includes a gate dielectric layer 24 and a gate electrode 25. The NMOS 12 includes a well 30 with a p-type dopant, source/drain regions 31 and 32 with n-type dopants, a gate stack 33, a liner 36 and a dielectric layer 37, wherein the gate stack 33 includes a gate dielectric layer 34 and a gate electrode 35. A p-type doped region includes p-type dopants such as boron; and an n-type doped region includes n-type dopants such as phosphorus or arsenic. An isolation feature 41 is formed in the semiconductor substrate 10 in order to isolate the PMOS 11 and NMOS 12.

Regarding the formation of the PMOS 11 and NMOS 12, a Local Oxidation of Silicon (LOCOS) or Shallow Trench Isolation (STI) is performed to define active regions of the semiconductor substrate 10 so as to form the isolation feature 41. Several implantations are performed to implant ions into the semiconductor substrate 10, thus forming the well 20 and the well 30. Next, a gate dielectric layer and a gate electrode layer are deposited on the semiconductor substrate 10, wherein the gate electrode layer is formed on the gate dielectric layer. The gate electrode layer and the gate dielectric layer are formed by chemical vapor deposition (CVD), physical vapor deposition (PVD), atomic layer deposition (ALD), high density plasma CVD (HDPCVD), plating, other suitable methods, or combinations thereof. The gate electrode layer is made of conductive material such as doped poly-silicon or metal. The gate dielectric layer includes a dielectric material, a high-k dielectric material, other suitable dielectric materials, or combinations thereof. Examples of a dielectric material include, but are not limited to, silicon oxide, silicon oxynitride, silicon nitride, or combinations thereof. Examples of high-k dielectric materials include, but are not limited to, HfO2, HfSiO, HfSiON, HfTaO, HfTiO, HfZrO, or combinations thereof. Lithography and etching processes are performed to pattern the gate dielectric layer and the gate electrode layer so as to form the gate stacks 23 and 33.

Next, the liner 26 and the dielectric layer 27 are formed on sidewalls of the gate stack 23 by depositing a first dielectric layer for defining the liner 26 and a second dielectric layer for defining the dielectric layer 27. The second dielectric layer is formed on the first dielectric layer. After the first and second dielectric layers are formed, the first and second dielectric layers are then anisotropically etched to form the liner 26 and the dielectric layer 27, wherein the dielectric layer 27 is formed on sidewalls of the liner 26. Similarly, the liner 36 and the dielectric layer 37 are formed on sidewalls of the gate stack 33 by etching the first and second dielectric layers. Specifically, the liners 26 and 36 are conformally formed on the gate stacks 23 and 33. Further, the liner 26 interfaces the sidewall of the gate stack 23 and the semiconductor substrate 10; and the liner 36 interfaces the sidewall of the gate stack 33 and the semiconductor substrate 10, wherein the liners 26 and 36 are formed as an L-shape in a cross-sectional view. The liners 26 and 36 include an oxide material, such as silicon oxide and/or another suitable dielectric material. The dielectric layers 27 and 37 include a nitride material, such as silicon nitride, silicon oxide, silicon oxynitride, or combinations thereof. The liners 26 and 36 are configured to protect the gate stacks 23 and 33 from being damaged during subsequent processes. The dielectric layers 27 and 37 can be regarded as dummy sidewall spacers for protecting underlying channel regions. Later, several ion implantations are performed to implant ions into the semiconductor substrate 10 so as to form the source/drain regions (21, 22, 31, and 32) adjacent to the gate stacks 23 and 33. During ion implantations, the dielectric layers 27 and 37 are subject to implanted ions and serve as a mask for self-aligning when forming source/drain regions (21, 22, 31, and 32). It is optional whether to strip off the dummy sidewall spacers or not.

A pre-amorphization implant (PAI) represented by arrows 50 is performed to amorphize the gate electrodes (25, 35) and the source/drain regions (21, 22, 31, and 32). Any dielectric layers on the gate electrodes or the source/drain regions are completely removed prior to the PAI 50. The PAI 50 is represented by arrows indicating the introduction of impurities into the gate electrodes (25, 35) and the source/drain regions (21, 22, 31, and 32). The PAI 50 breaks the single crystal or polycrystalline bonding into amorphous bonding. Further, the PAI 50 is a high energy, high dosage implant used to amorphize exposed regions so as to effectuate more recrystallization during subsequent annealing processes. The PAI 50 includes dopant species, for example, xenon, which is a heavy ion having the appropriate inertial properties. Other suitable heavy elements such as As, Ge, In, or others are used in different examples. The presence of the dielectric layers 27 and 37 prevents channel regions 28 and 38 from being damaged or attacked by high energy ions during the high energy PAI process.

Figure 1B:
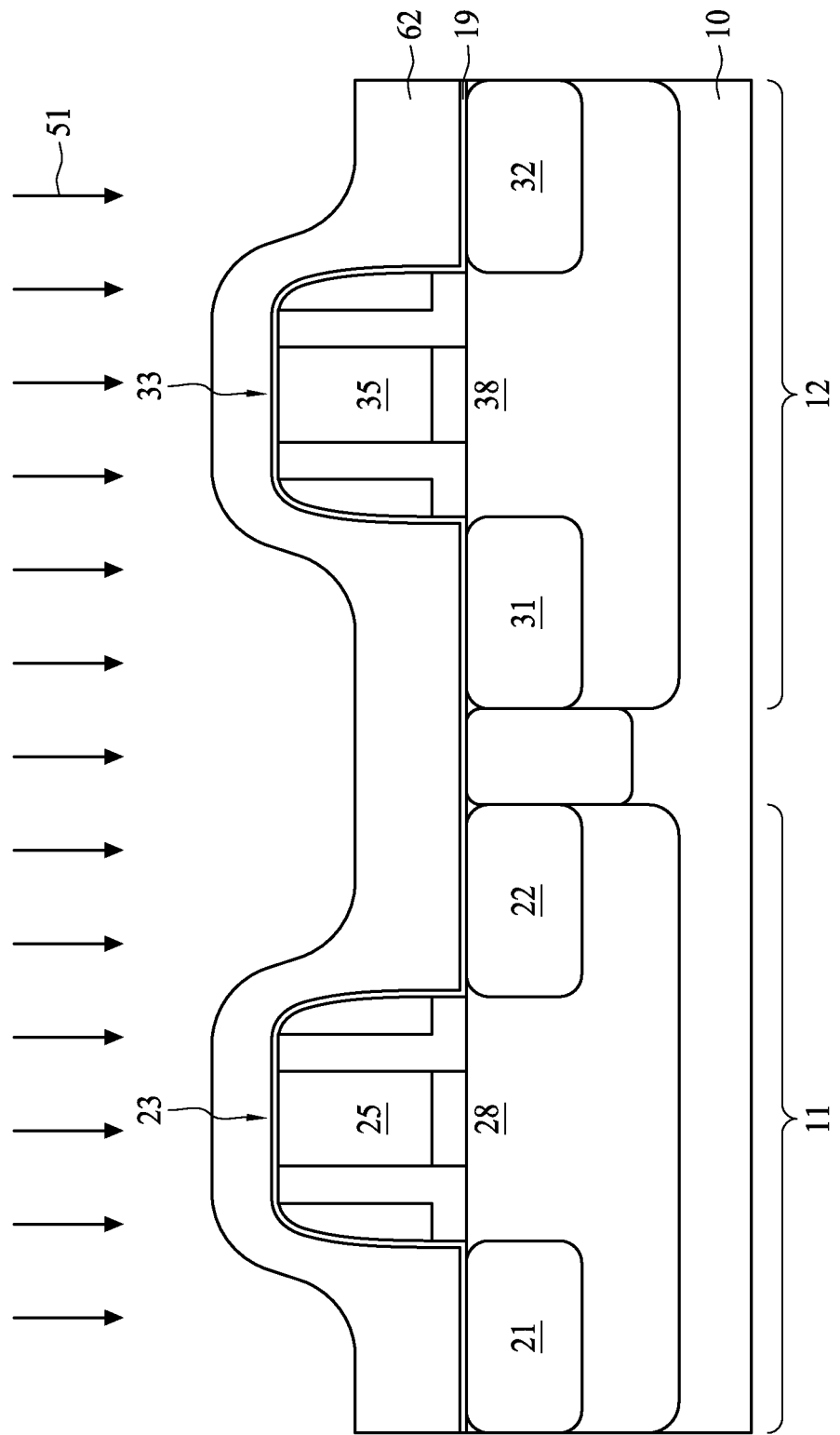

Referring to FIG. 1B, a capping layer 62 is formed to blanket over the gate stacks 23 and 33 and the semiconductor substrate 10 by a deposition 51. The capping layer 62 contacts with the gate electrodes (25, 35) and the source/drain regions (21, 22, 31, and 32). The capping layer 62 refers to a stress memorization technology (SMT) layer, which will provide gate electrodes and source/drain regions with a predetermined stress, i.e., a tensile stress or a compressive stress after an annealing process. The capping layer 62 has a lattice constant different from that of the gate electrodes or the source/drain regions so that a stress between two materials is formed. Further, the capping layer 62 is made of dielectric material, for example, nitrides, oxides, oxynitride, tetra-ethyl-ortho-silicate (TEOS), other suitable materials, or combinations thereof.

In some embodiments, an oxide layer 19 is optionally formed over the semiconductor substrate 10 prior to the formation of the capping layer 62. The oxide layer 19 is made of, for example, silicon oxide. In subsequent processes, an implantation or etching process can damage the underlying regions such as the source/drain regions. The oxide layer 19 serves as an etch stop layer and protects the gate stacks and source/drain regions.

In some embodiments, an implantation (not shown) is performed on the capping layer 62 so as to release or adjust the stress value. The implantation breaks the bonding of the capping layer 62 so that impurities of the implantation are bonded to the capping layer 62 in the next annealing processes. Further, the implantation is performed to blanket or only cover some specific regions such as the capping layer 62 above the PMOS 11. The implantation includes dopant species, for example, xenon, which is a heavy ion having the appropriate inertial properties. Other suitable heavy or light elements such as As, Ge, In, or others are used in different examples. In some embodiments, a portion of the capping layer 62 is thinned down by a recess process. The other portions of the capping layer 62 have a larger thickness than the thinned portion, which creates different stress values in several regions after annealing.

Figure 1C:
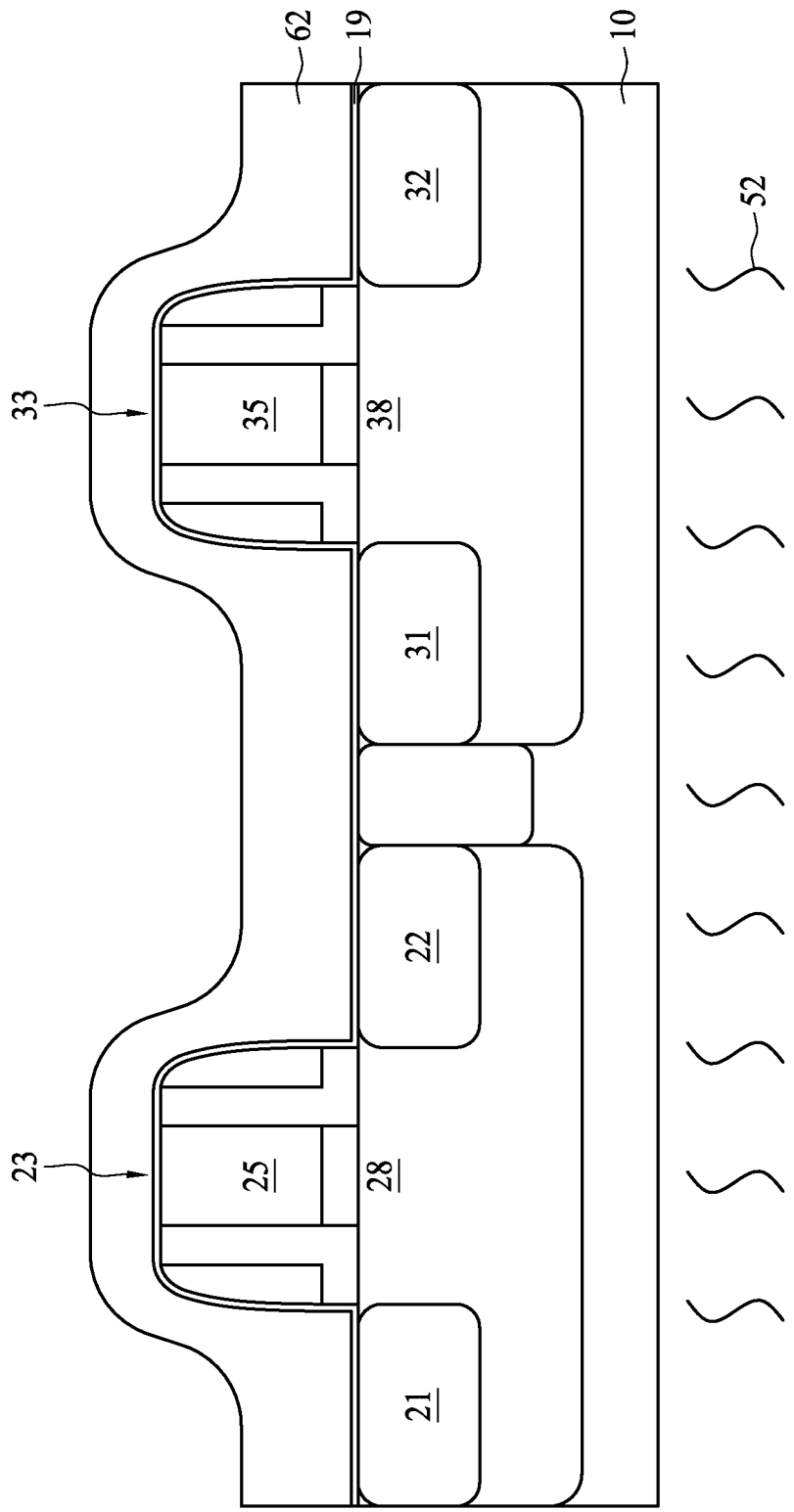

Referring to FIG. 1C, an annealing process 52 is performed on the capping layer 62 and the semiconductor substrate 10 so as to recrystallize and deform the gate electrodes 25 and 35. As a cooling operation occurs in the annealing process 52, the gate electrodes 25 and 35 are recrystallized into single crystal or polycrystalline bonds and then solidify. As such, the deformed gate electrodes transfer the stress into the channel regions 28 and 38 beneath the gate stacks 23 and 33. Further, the source/drain regions (21, 22, 31, and 32) are also recrystallized and deformed so as to provide stress to the channel regions (28, 38) and thus increase a stress value of the channel regions (28, 38). As such, the stress provided by the capping layer 62 transfers to the channel regions (28, 38) via the source/drain regions (21, 22, 31, and 32) and the gate electrodes 25 and 35. In other words, the stress is retained or memorized in the gate electrodes (25, 35) and the source/drain regions (21, 22, 31, and 32), thereby enhancing carrier mobility and performance of the PMOS 11 and NMOS 12. In addition, a stress value of the capping layer 62 is also increased as the Si—N—H bonds are broken in the capping layer 62 and more H atoms escape, which causes the capping layer 62 to be more tensile or compressive during the annealing process 52. The increased stress value of the capping layer 62 provides a greater stress value for the gate electrodes and the source/drain regions. Examples of the annealing process 52 include, but are not limited to, RTA, furnace annealing, flashing annealing, laser annealing, and other suitable processes. The annealing process 52 adopts a high temperature anneal, for example, an S/D anneal, which is needed to enhance/modulate the stress in the capping layer 62. The S/D anneal can recrystallize and deform the gate electrodes and source/drain regions and then transfer the stress to the channel regions. The S/D anneal can be performed at a temperature between 600 and 1300 C for a time between close to 0.1 seconds and 5 minutes (spike or laser anneal). In another example, the temperature is between 850 and 1300 C or between 925 and 1300 C.

Figure 1D:
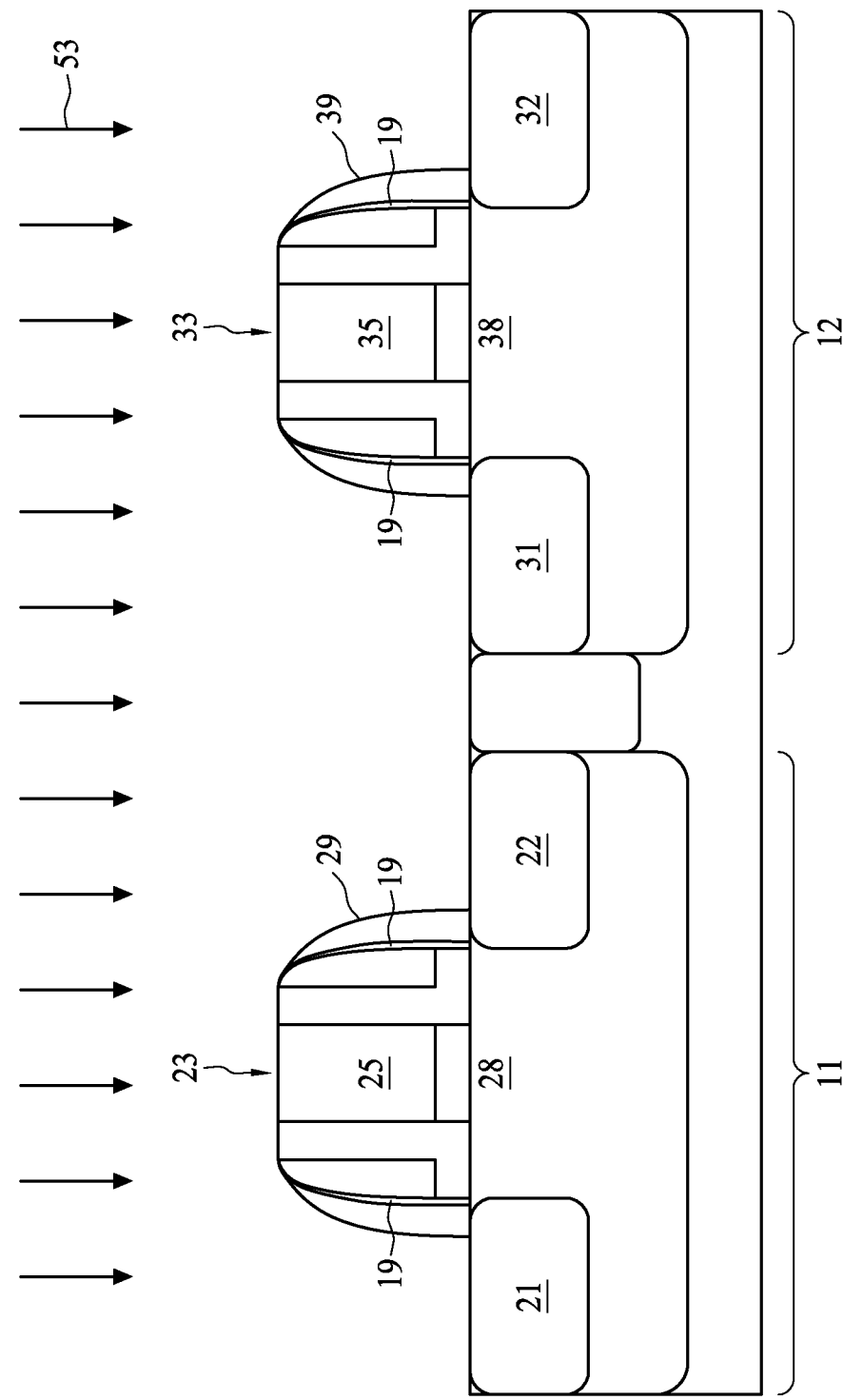

Referring to FIG. 1D, a portion of the capping layer 62 is removed by an etching process 53, thereby forming sidewall spacers 29 and 39 around the gate stacks 23 and 33. The etching process 53 utilizes a dry etching process such as a reactive ion etch (RIE) which anisotropically etches the capping layer 62. The etching process 53 includes a chemical molecule, such as $Cl_2$, $SF_6$, $N_2$, $CF_4$, $CHF_3$, $CH_2F_2$, $N_2H_2$, $O_2$, He or Ar. The sidewall spacers 29 and 39 refer to main sidewall spacers for the PMOS 11 and NMOS 12. Therefore, the capping layer 62 (SMT layer) is served as a main sidewall spacer instead of being removed. The capping layer 62 remaining over the channel regions 28 and 38 prevents the stress from being released during subsequent processes. In this example, the PMOS 11 and NMOS 12 obtain the same stress value from the sidewall spacers 29 and 39. The same stress value transferred to channel regions may cause different stress values in the channel regions 28 and 38 due to different types of majority carrier. The sidewall spacers 29 and 39 are able to increase and maintain the stress values in the channel regions 28 and 38.

Figure 1E:
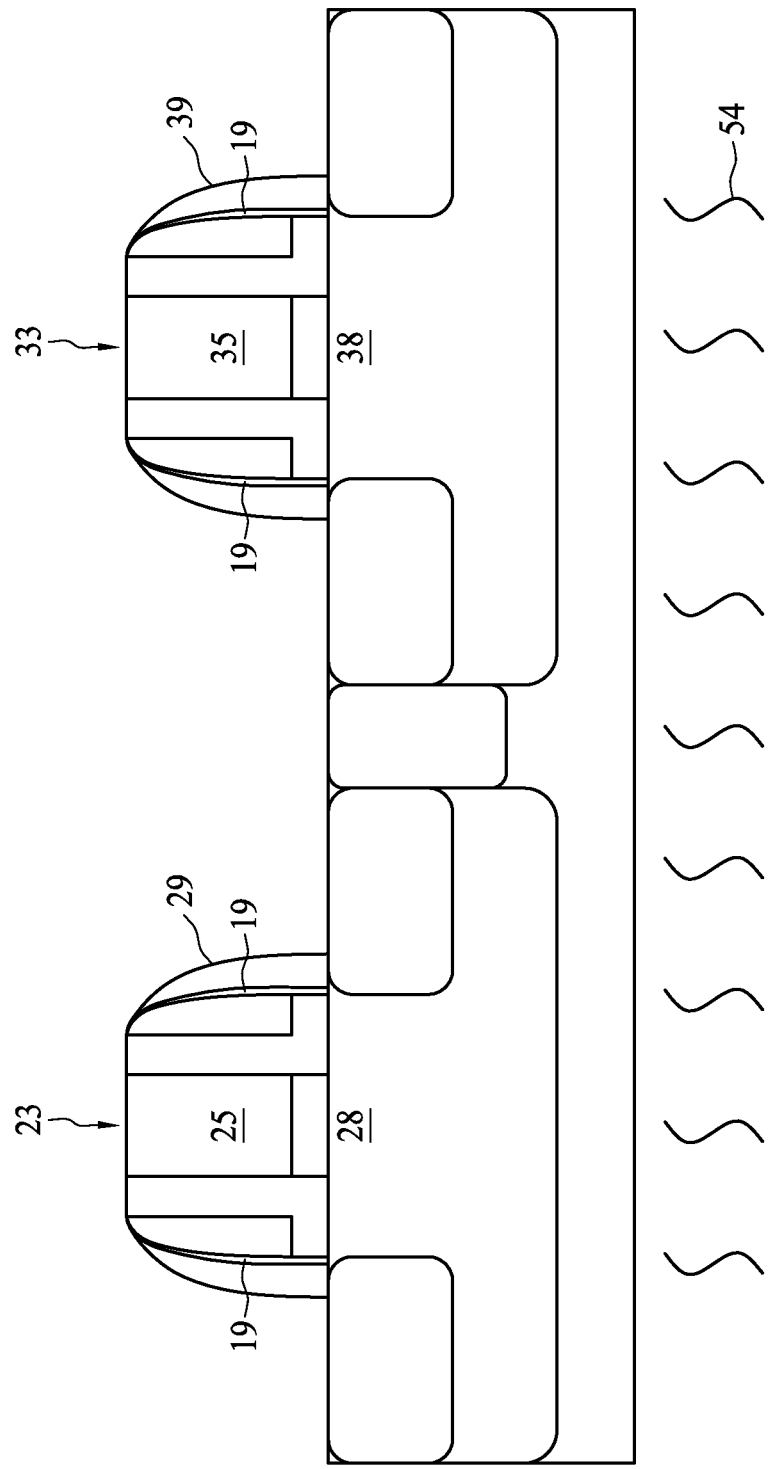

Referring to FIG. 1E, an annealing process 54 is performed on the sidewall spacers 29 and 39 and the semiconductor substrate 10 so as to repair damages formed in the PMOS 11 and NMOS 12 during previous etching processes. The annealing process 54 also utilizes the condition of the S/D anneal, wherein the temperature of the annealing process 54 is the same as that of the annealing process 52.

During the formation of the main sidewall spacers, the SMT layer transfers the stress into the channel regions at the same time. Fewer nitride layers are utilized so as to reduce the cost of the manufacturing process. Due to fewer operations, the process window or margin becomes greater so that a yield can be improved and defects are reduced. Further, using the remaining SMT layer as a main sidewall spacer also enhances the stress introduced into the channel region. During subsequent processes, the stress in the channel region will be maintained and not be released because of memorization of the remaining SMT layer. With the remaining SMT layer, speed and current performance of devices can be improved.

Figure 1F:
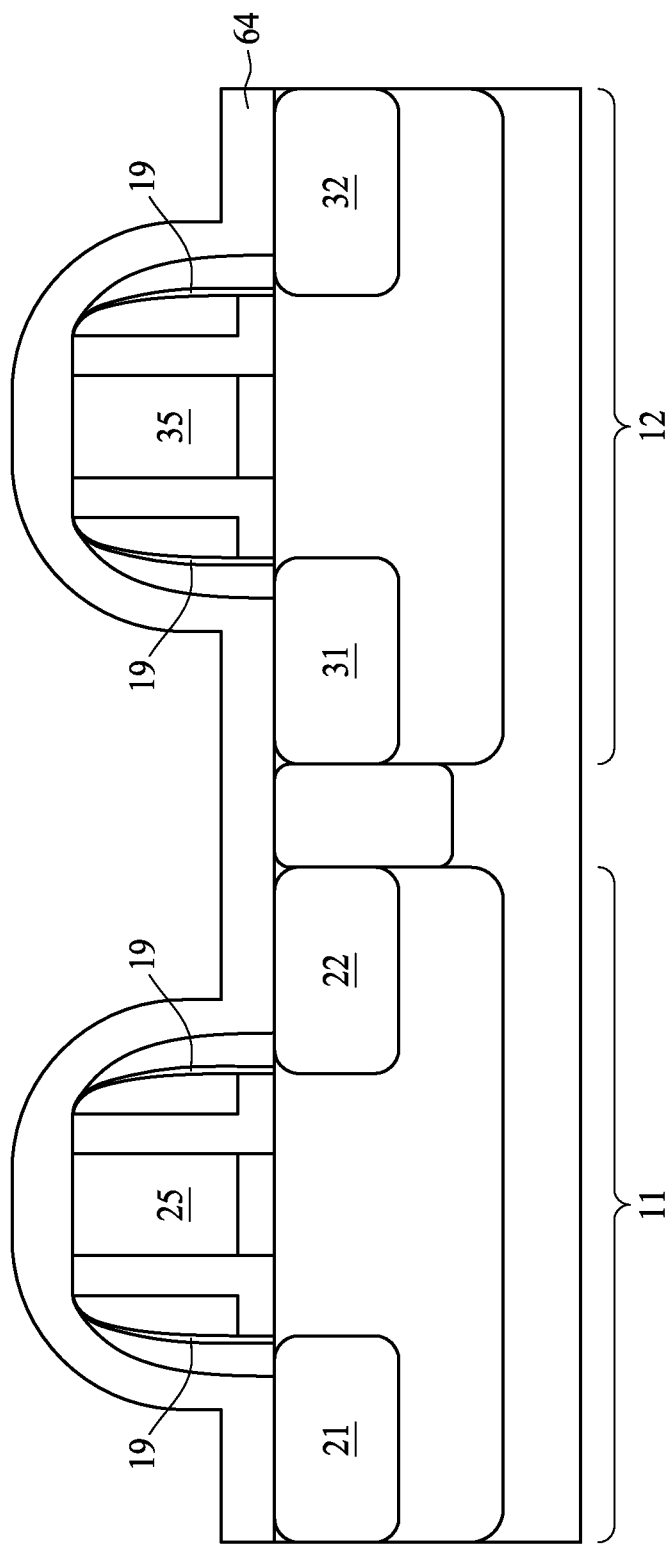

Referring to FIG. 1F, a metal layer 64 is deposited over the gate electrodes (25, 35) and the source/drain regions (21, 22, 31, and 32). Exemplary and non-limiting metals that can be deposited include nickel, platinum or titanium. The thickness of the metal layer 64 is about several angstroms, which may be about 6 angstroms to about 8 angstroms.

Figure 1G:
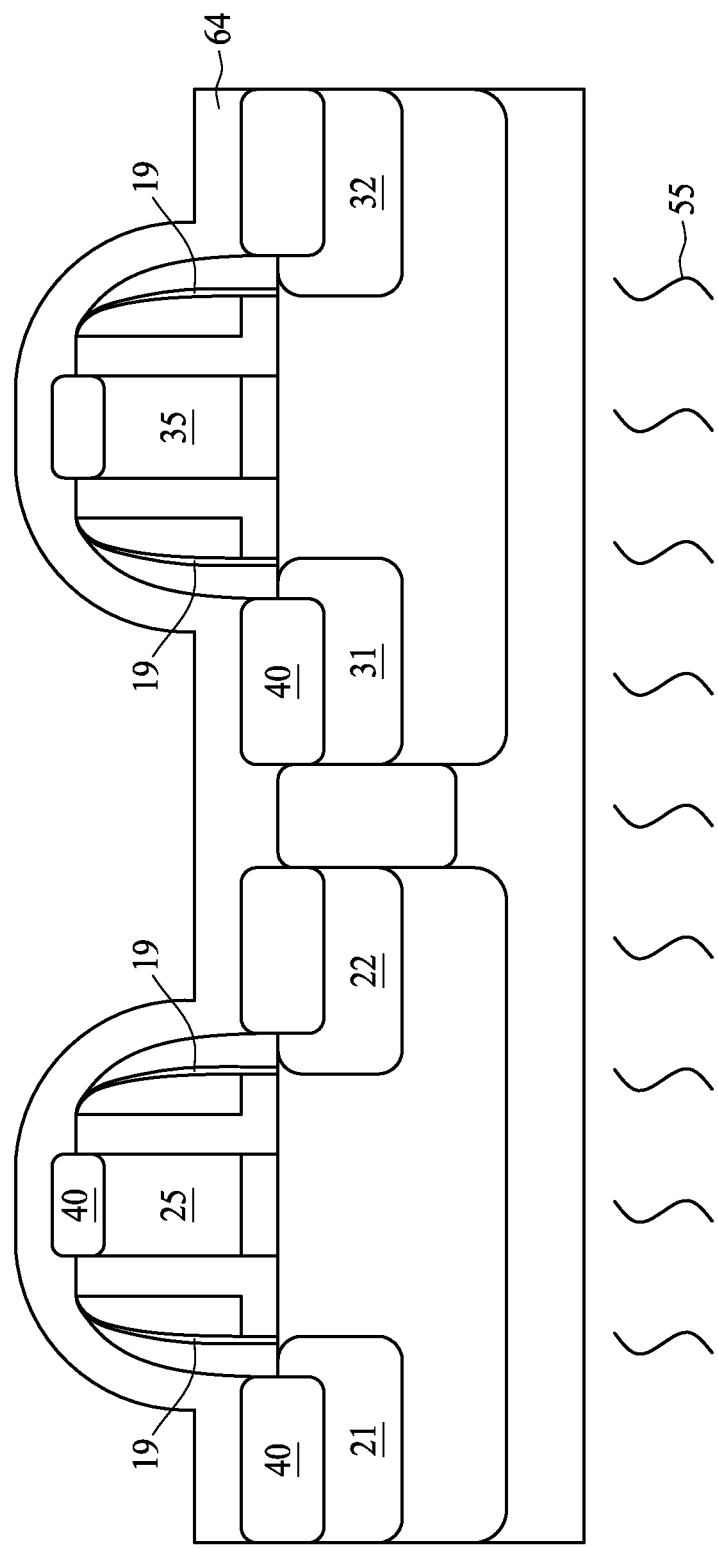
Figure 1H:
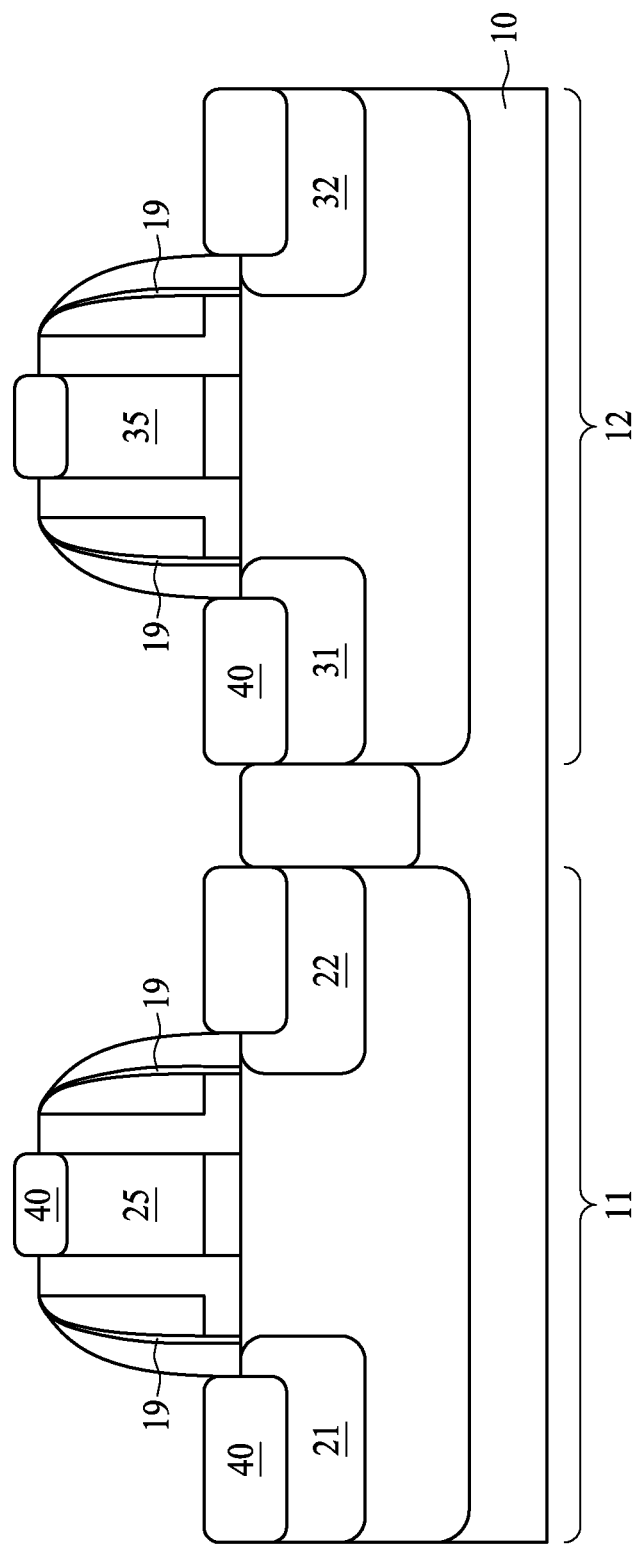

Referring to FIG. 1G, an annealing process 55 is performed to partially silicide the gate electrodes (25, 35) and the source/drain regions (21, 22, 31, and 32). The metal layer 64 reacts with the semiconductor materials of the gate electrodes and the source/drain regions. The annealing process 55 thus produces silicide layers 40 between the metal layer 64 and the semiconductor materials, wherein the silicide layers 40 are formed based on the gate electrodes and the source/drain regions. For example, a silicide layer 40 is formed on a top portion of the gate electrode 25; and a silicide layer 40 is formed on a top portion of the source/drain region 21. The annealing process 55 includes at least one thermal treatment, for example, rapid thermal annealing, laser annealing or flash annealing. The silicide layers 40 include, for example, NiSi, PtSi or TiSi. Later, unreacted portions of the metal layer 64 are stripped away by a wet etch or a dry etch shown in FIG. 1H.

Figure 1I:
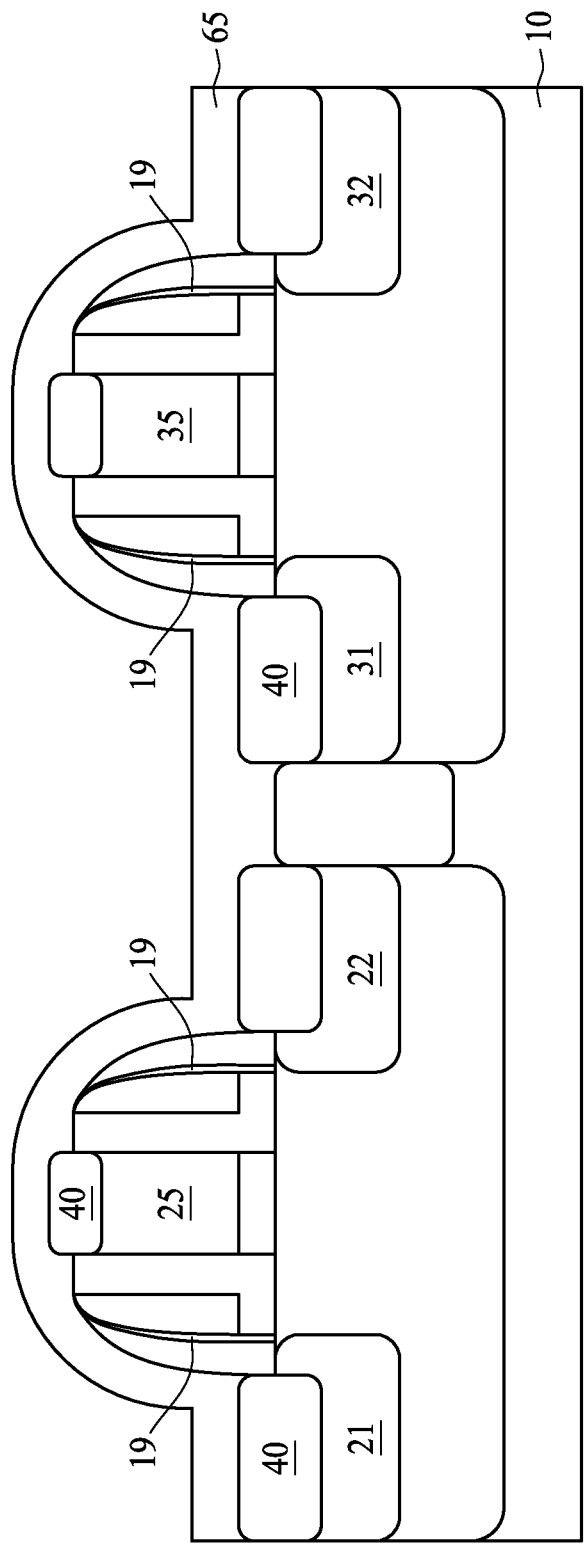
Figure 1J:
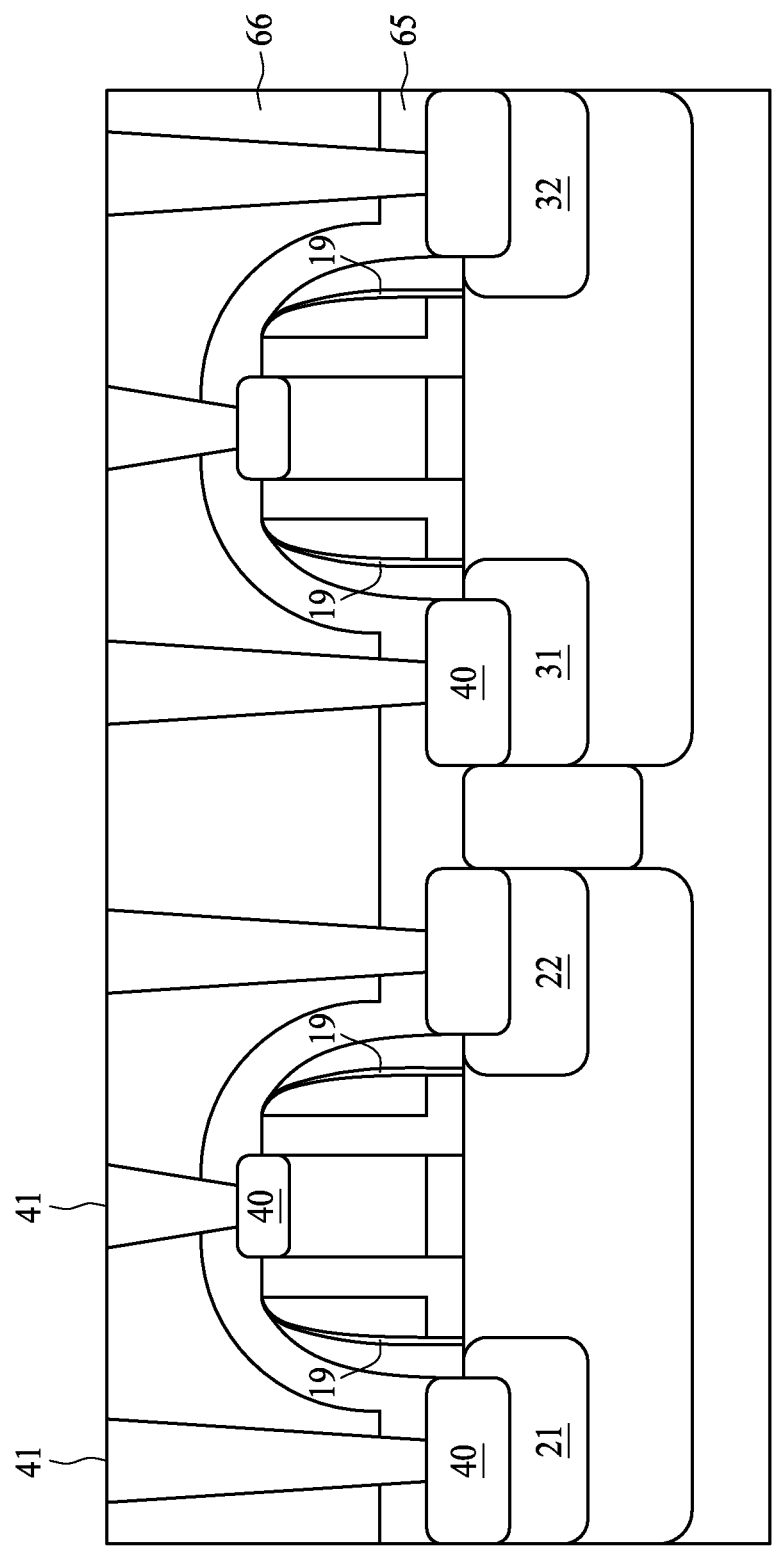

Referring to FIG. 1I, a contact etch stop layer (CESL) 65 is formed over the semiconductor substrate 10. The CESL 65 is similar to the capping layer 62, which is made of dielectric material, for example, nitrides, oxides, oxynitride, tetra-ethyl-ortho-silicate (TEOS), other suitable materials, or combinations thereof. The CESL 65 contacts with the silicide layers 40, wherein the CESL 65 serves as an etching stop layer and a stress memorization layer at the same time. The CESL 65 provides a predetermined stress for the gate electrodes (25, 35) and source/drain regions (21, 22, 31, and 32), i.e. a tensile stress or a compressive stress after an annealing process. Later, a dielectric layer 66 is deposited over the semiconductor substrate 10 as shown in FIG. 1J. The dielectric layer 66 includes, for example, a layer of borophosphosilicate glass (BPSG) between 5,000 and 15,000 angstroms in thickness. A photoresist layer (not shown) is applied over the dielectric layer 66. A standard photolithographic technique is performed to pattern the photoresist layer. An etching process (not shown) is employed to etch the dielectric layer 66 and form contact openings, which expose a top surface of the silicide layers 40. The CESL 65 serves as an etching stop layer when etching the dielectric layer 66. End-point equipment will detect material signals of the CESL 65 so as to expose the underlying silicide layers 40 by a correct etching time. A contact metal layer is then deposited in a blanketed fashion into the contact openings so as to form contact plugs 41 in contact with the silicide layers 40. The contact metal includes copper, aluminum, or tungsten. Later, a polishing process, such as Chemical Mechanical Polishing, is used to remove uneven portions of the contact metal layer.

In another embodiment, FIGS. 2A-2G represent a method of manufacturing a stress memorization technology (SMT) sidewall spacer in accordance with some embodiments of the present disclosure. Each figure represents a stage of the method in a cross-sectional perspective view.

Figure 2A:
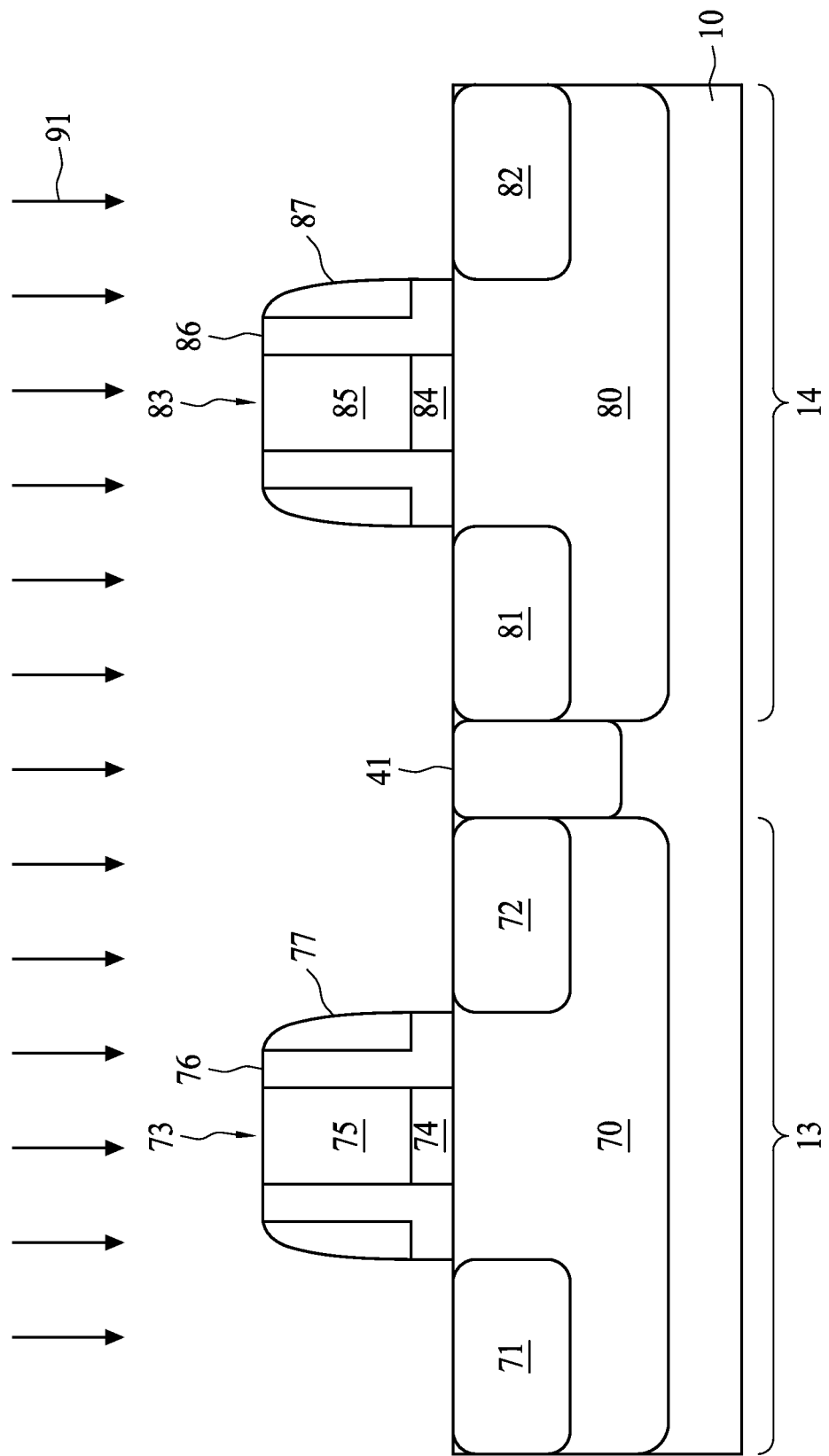
FIGS. 2A-2G are cross-sectional views illustrating a method of manufacturing a stress memorization technology (SMT) sidewall spacer in accordance with some embodiments of the present disclosure.

Referring to FIG. 2A, a semiconductor substrate 10 is provided, wherein the semiconductor substrate 10 includes a PMOS 13 and an NMOS 14. The PMOS 13 includes a well 70 with an n-type dopant, source/drain regions 71 and 72 with p-type dopants, a gate stack 73, a liner 76 and a dielectric layer 77, wherein the gate stack 73 includes a gate dielectric layer 74 and a gate electrode 75. The NMOS 14 includes a well 80 with a p-type dopant, source/drain regions 81 and 82 with n-type dopants, a gate stack 83, a liner 86 and a dielectric layer 87, wherein the gate stack 83 includes a gate dielectric layer 84 and a gate electrode 85. A p-type doped region includes p-type dopants such as boron; and an n-type doped region includes n-type dopants such as phosphorus or arsenic. An isolation feature 41 is formed in the semiconductor substrate 10 in order to isolate the PMOS 13 and NMOS 14.

A pre-amorphization implant (PAI) represented by arrows 91 is performed to amorphize the gate electrodes (75, 85) and the source/drain regions (71, 72, 81, and 82). Any dielectric layers on the gate electrodes or the source/drain regions are completely removed prior to the PAI 91. The PAI 91 breaks the single crystal or polycrystalline bonding into amorphous bonding. The PAI 91 includes dopant species, for example, xenon which is a heavy ion having the appropriate inertial properties. Other suitable heavy elements such as As, Ge, In, or others are used in different examples.

Figure 2B:
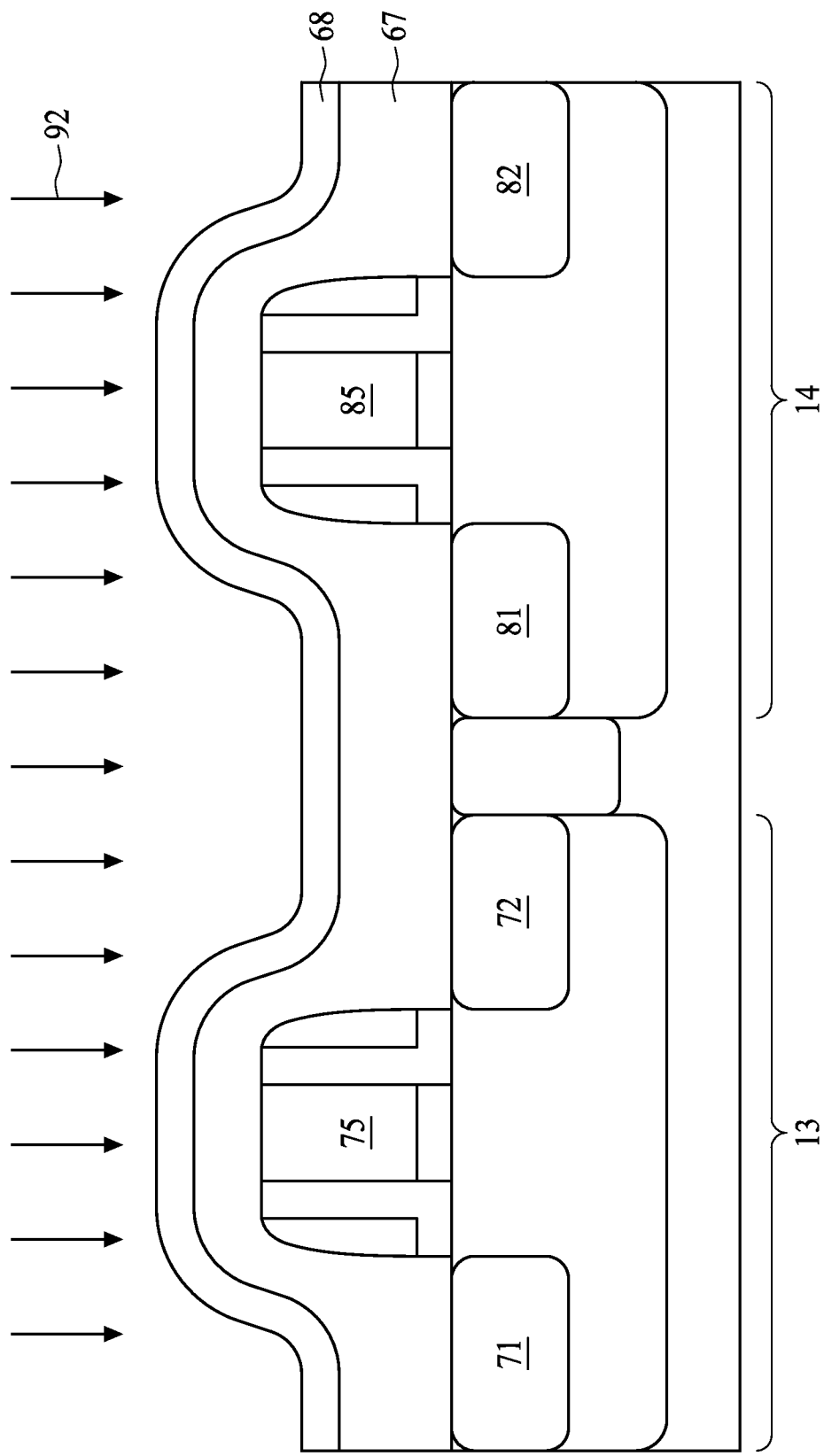

Referring to FIG. 2B, a capping layer 67 is formed to blanket over the PMOS 13 and the NMOS 14 by a deposition 92. The capping layer 67 contacts with the gate electrodes (75, 85) and the source/drain regions (71, 72, 81, and 82). The capping layer 67 refers to a stress memorization technology (SMT) layer, wherein the capping layer 67 will provide gate electrodes and source/drain regions with a compressive stress after a subsequent annealing. Further, the capping layer 67 is made of dielectric material with a compressive stress, for example, nitrides, oxides, oxynitride, tetra-ethyl-ortho-silicate (TEOS), other suitable materials, or combinations thereof. In an embodiment, an etch stop layer 68 is formed on the capping layer 67. The etch stop layer 68 is made of dielectric material, for example, nitrides, oxides, oxynitride, tetra-ethyl-ortho-silicate (TEOS), other suitable materials, or combinations thereof.

Figure 2C:
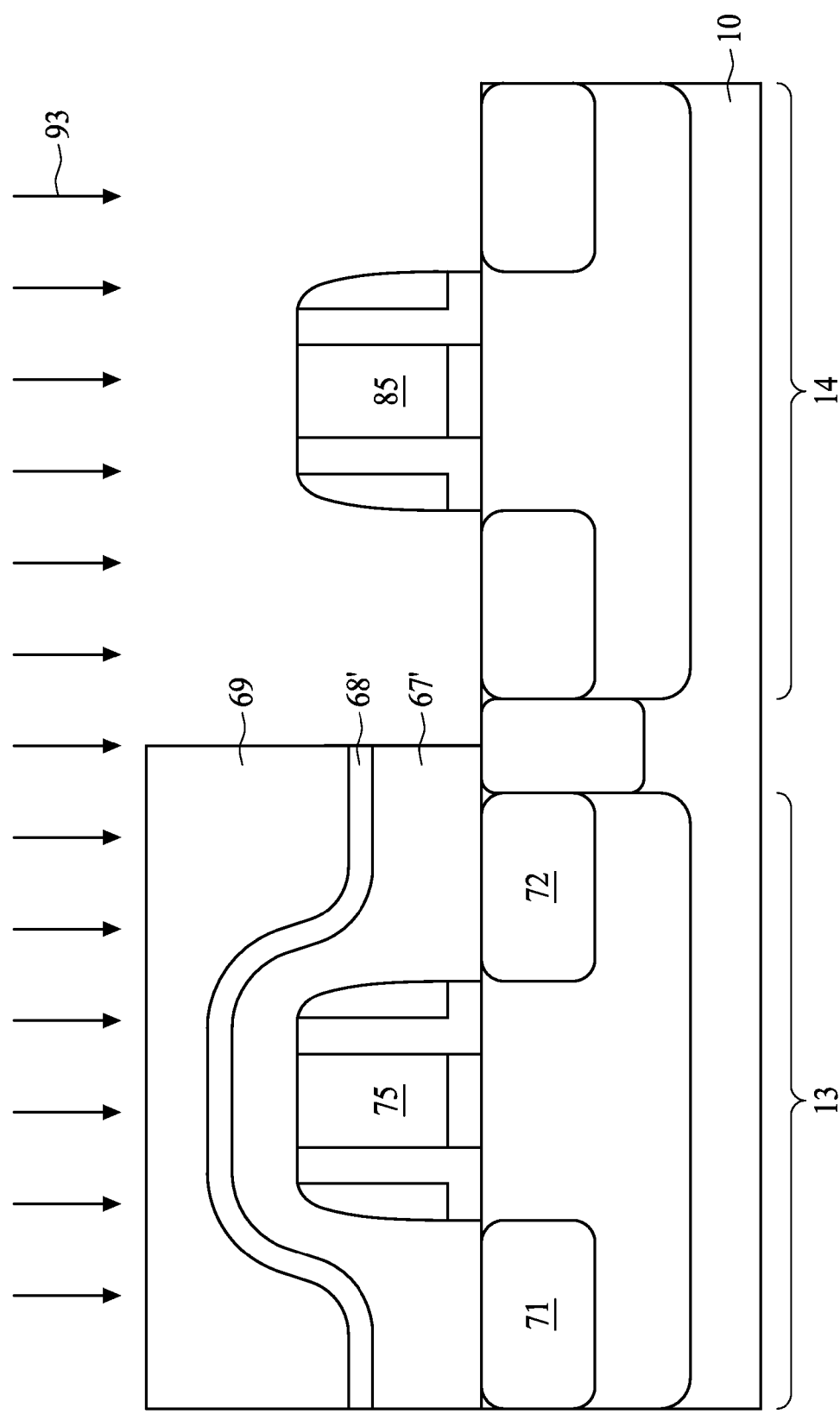

Referring to FIG. 2C, a patterned photoresist layer 69 is applied over the PMOS 13 and exposes the underlying etch stop layer 68 above the NMOS 14 by a standard photolithographic technique. An etching process 93 is employed to etch and remove an uncovered etch stop layer 68 and the capping layer 67 above the NMOS 14, thus forming a capping layer 67' and an etch stop layer 68' over the PMOS 13. The NMOS 14 thus is exposed; and the PMOS 13 is masked by a stack including the capping layer 67', the etch stop layer 68' and the patterned photoresist layer 69. The capping layer 67' covers over the PMOS 13 and exposes the NMOS 14, wherein the capping layer 67' contacts with the source/drain regions (71, 72) and the gate electrode 75. Later, the patterned photoresist layer 69 is stripped away by a chemical solution or a dry etching.

Figure 2D:
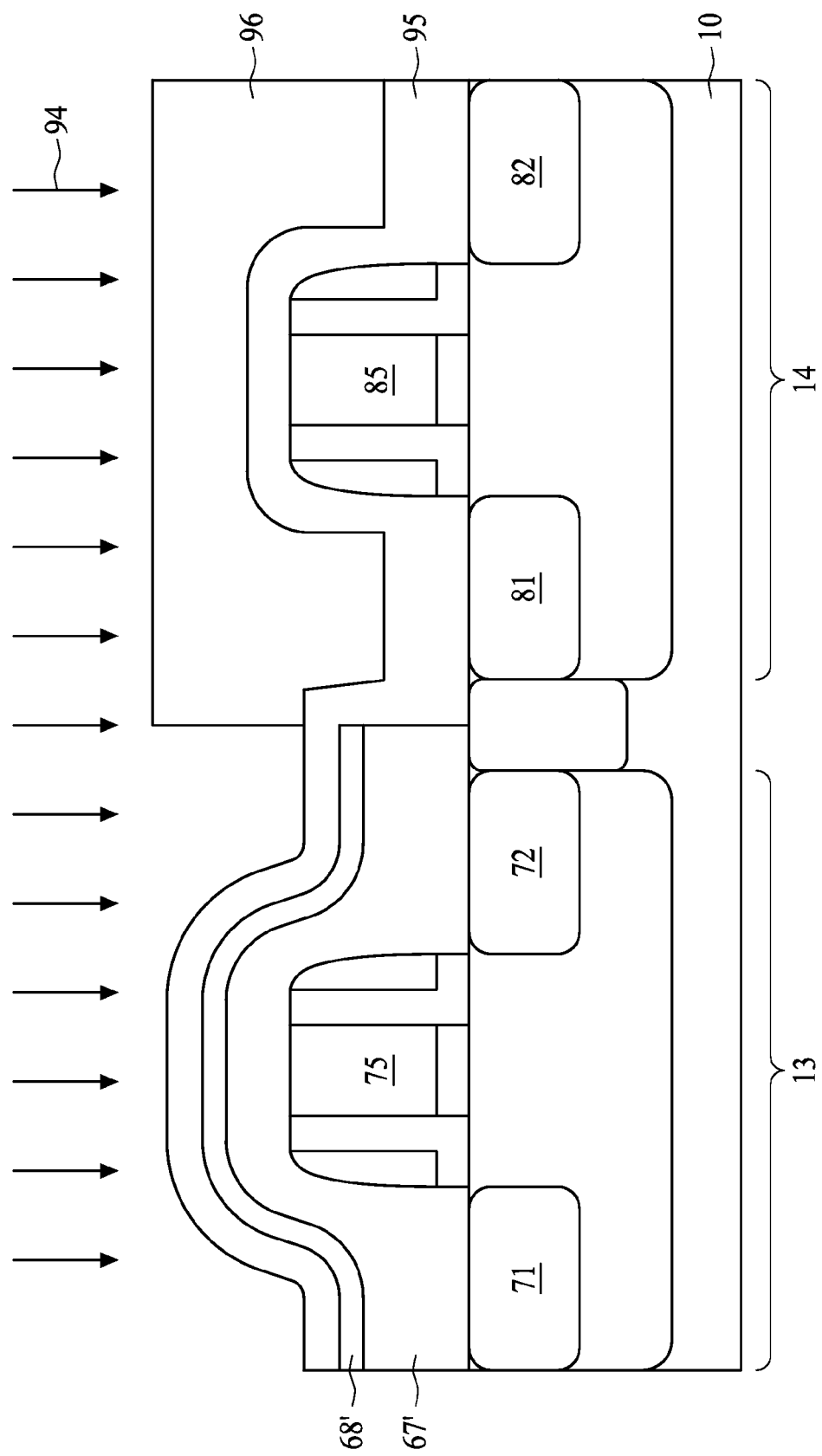

Referring to FIG. 2D, a capping layer 95 is formed to blanket over the PMOS 13 and the NMOS 14 by a deposition. The capping layer 95 contacts with the gate electrode 85 and the source/drain regions (81, 82). Further, the capping layer 95 refers to a stress memorization technology (SMT) layer with a tensile stress, wherein the capping layer 95 will provide gate electrodes and source/drain regions with a tensile stress after a subsequent annealing. Further, the capping layer 95 is made of dielectric material with a tensile stress, for example, nitrides, oxides, oxynitride, tetra-ethyl-ortho-silicate (TEOS), other suitable materials, or combinations thereof.

A patterned photoresist layer 96 is applied over the NMOS 14 and exposes the underlying capping layer 95 above the PMOS 13 by a standard photolithographic technique. An etching process 94 is then performed to etch the capping layer 95 above the PMOS 13. The etch stop layer 68' is disposed between the capping layer 95 and the capping layer 67', wherein the etch stop layer 68' protects the capping layer 67' during the etching process 94. The etching process 94 utilizes a dry etching process such as a reactive ion etch (RIE) which etches the capping layer 95. The etching process 94 includes a chemical molecule, such as $Cl_2$, $SF_6$, $N_2$, $CF_4$, $CHF_3$, $CH_2F_2$, $N_2H_2$, $O_2$, He or Ar. The patterned photoresist layer 96 is then removed after the etching process 94.

Figure 2E:
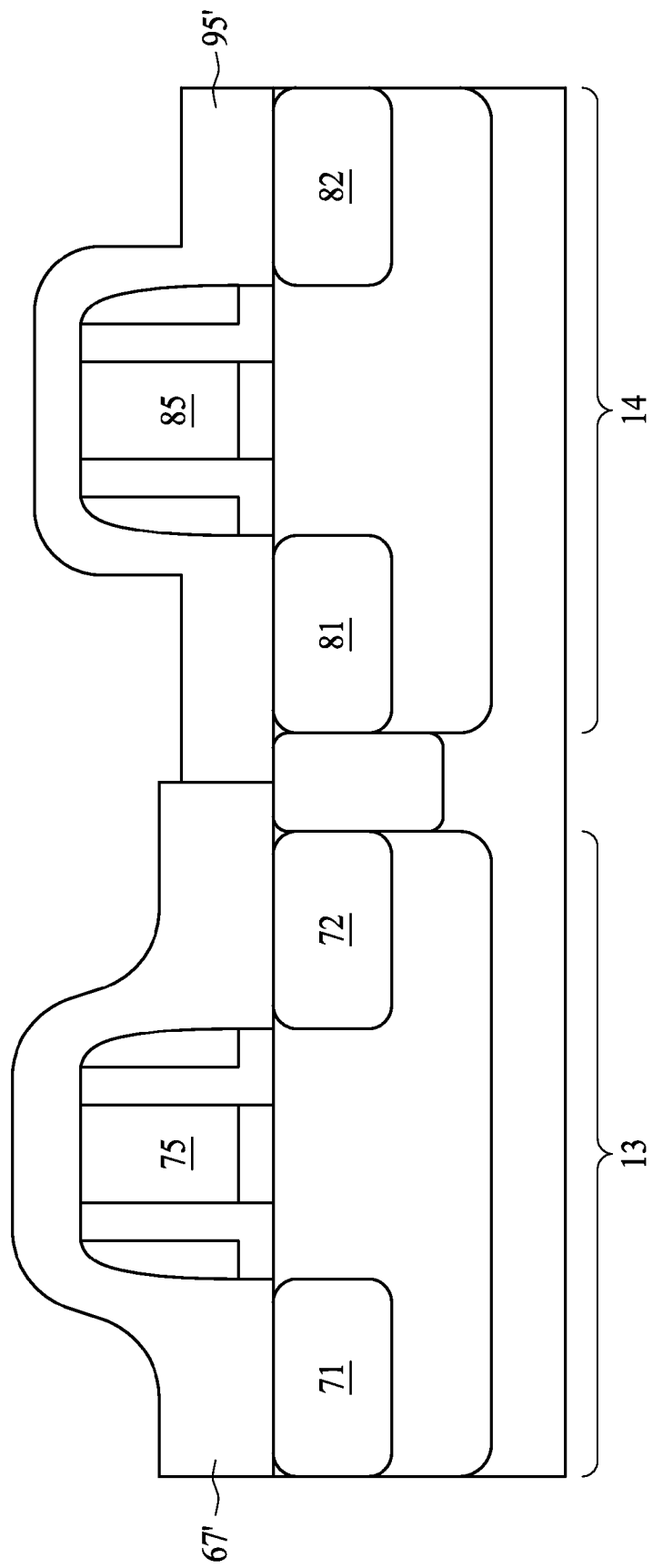

Referring to FIG. 2E, the capping layer 95 above the PMOS 13 and the etch stop layer 68' is removed. A capping layer 95' is formed on the NMOS 14, wherein the capping layer 95' contacts with the gate electrode 85 and the source/drain regions (81, 82). The capping layer 67' remains over the PMOS 13, wherein the capping layer 67' contacts with the gate electrode 75 and the source/drain regions (71, 72).

Figure 2F:
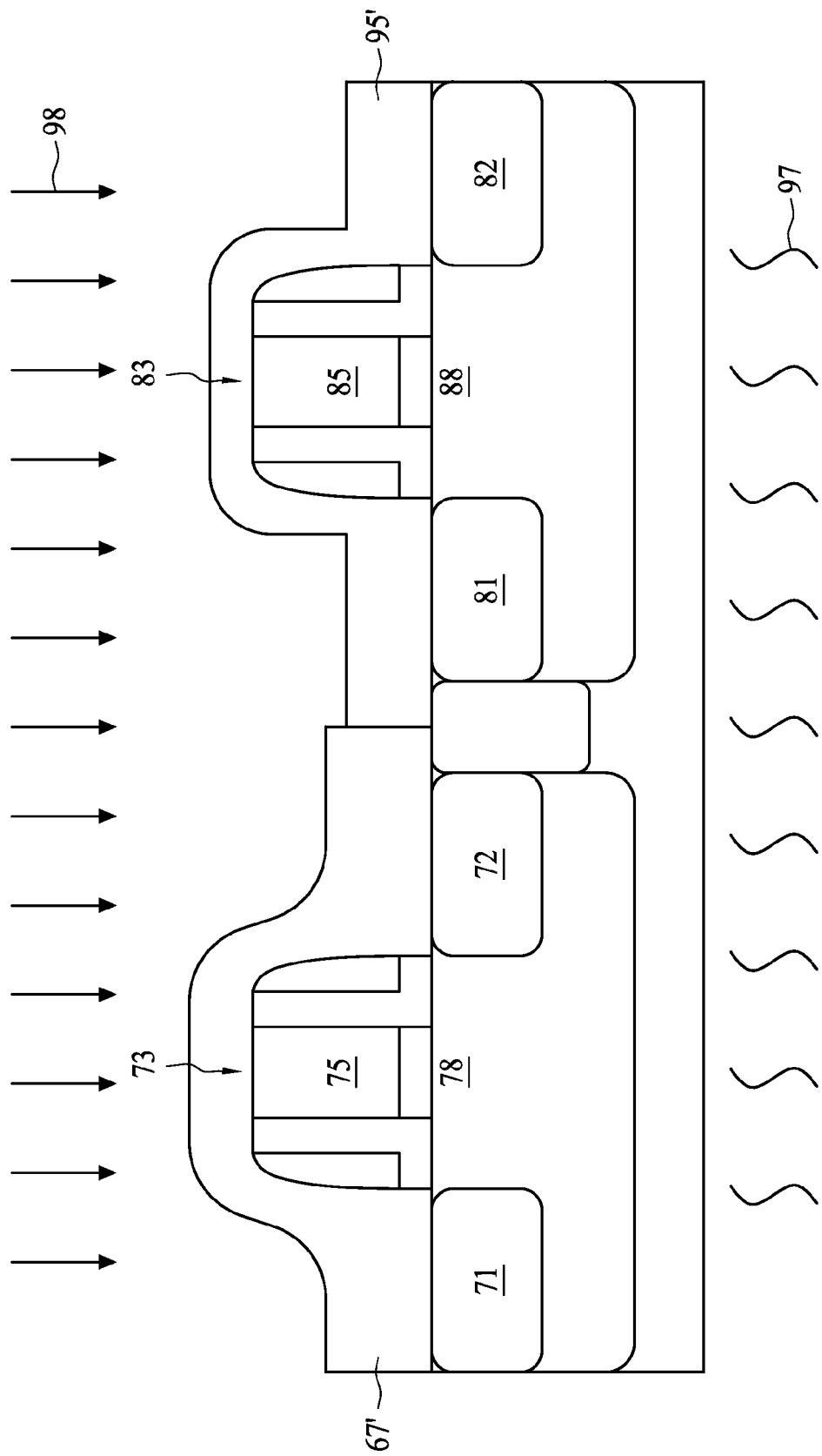

Referring to FIG. 2F, an annealing process 97 is performed on the capping layer 67' and the capping layer 95' so as to recrystallize and deform the source/drain regions (71, 72, 81, and 82) and the gate electrodes (75, 85). As a cooling operation occurs in the annealing process 97, the gate electrodes (75, 85) are recrystallized into single crystal or polycrystalline bonds and then solidify. As such, the deformed gate electrode 75 transfers the compressive stress provided by the capping layer 67' into a channel region 78 beneath the gate stack 73. Further, the source/drain regions (71, 72) are also recrystallized and deformed so as to compress the channel region 78 and increase a stress value of the channel region 78. As such, the compressive stress provided by the capping layer 67' transfers to the channel region 78 via the source/drain regions (71, 72) and gate electrode 75. In other words, the compressive stress is retained or memorized in the gate electrode 75 and the source/drain regions (71, 72), thereby enhancing carrier mobility and performance of the PMOS 13. Similarly, the deformed gate electrode 85 transfers the tensile stress provided by the capping layer 95' into a channel region 88 beneath the gate stack 83. Further, the source/drain regions (81, 82) are also recrystallized and deformed so as to increase tensile stress in the channel region 88 and thus increase a stress value of the channel region 88. As such, the tensile stress provided by the capping layer 95' transfers to the channel region 88 via the source/drain regions (81, 82) and gate electrode 85. In other words, the tensile stress is retained or memorized in the gate electrode 85 and the source/drain regions (81, 82), thereby enhancing carrier mobility and performance of the NMOS 14. Examples of the annealing process 97 include, but are not limited to, RTA, furnace annealing, flashing annealing, laser annealing, and other suitable processes. The annealing process 97 is similar to the annealing process 52, which is an S/D annealing.

An etching process 98 is then performed by anisotropically etching the capping layer 67' and the capping layer 95'. The etching process 98 utilizes a dry etching process such as a reactive ion etch (RIE), wherein the etching process 98 includes a chemical molecule, such as $Cl_2$, $SF_6$, $N_2$, $CF_4$, $CHF_3$, $CH_2F_2$, $N_2H_2$, $O_2$, He or Ar.

Figure 2G:
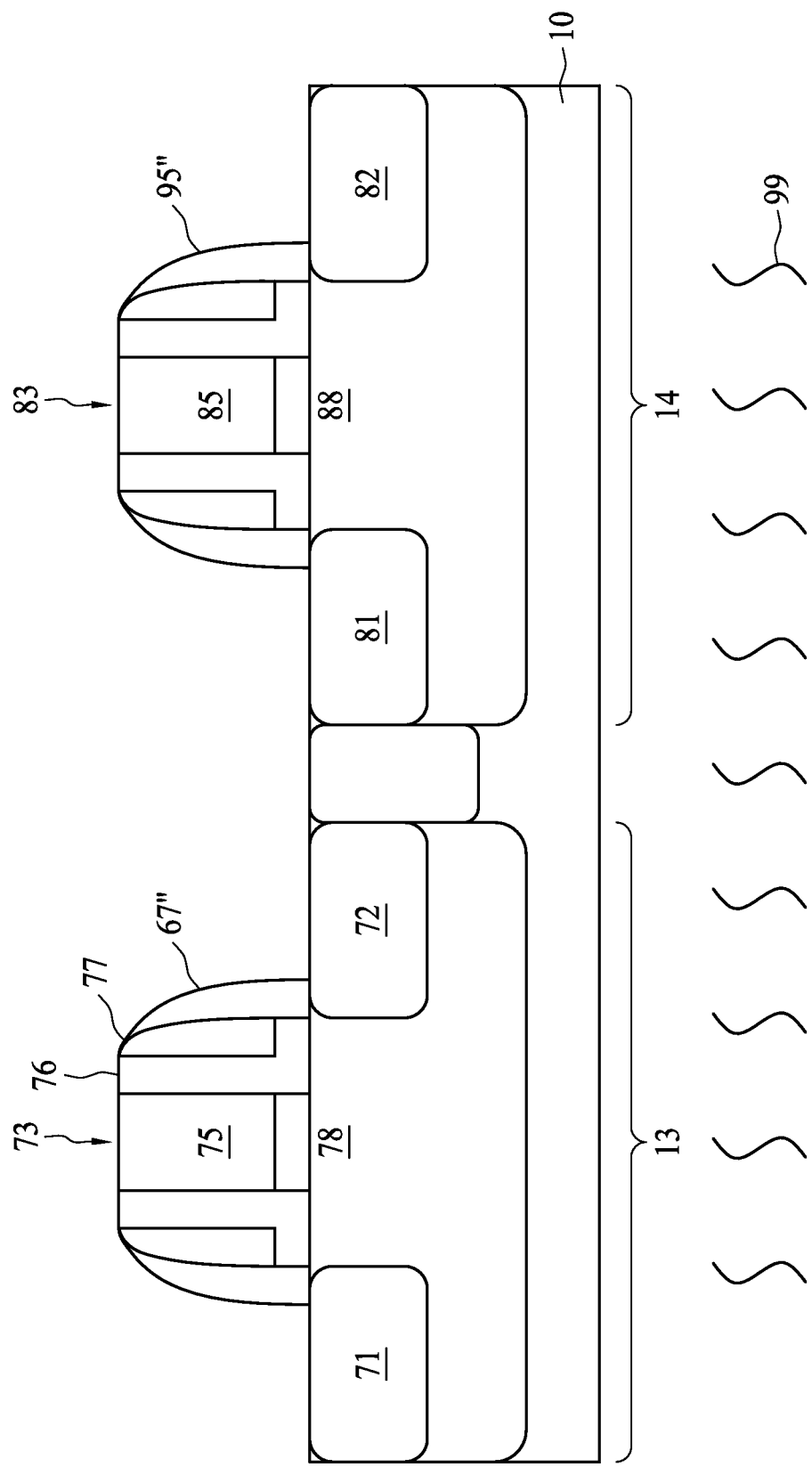

Referring to FIG. 2G, the capping layer 67' and the capping layer 95' are shaped as sidewall spacers after the etching process 98, thus forming a sidewall spacer 67" around the gate stack 73 and a sidewall spacer 95" around the gate stack 83. The sidewall spacer 67" (compressive SMT layer) is served as a main sidewall spacer for the PMOS 13 instead of being removed. The sidewall spacer 67" above the channel region 78 prevents the compressive stress from being released during subsequent processes. The sidewall spacer 95" (tensile SMT layer) is served as a main sidewall spacer for the NMOS 14 instead of being removed. The sidewall spacer 95" above the channel region 88 prevents the tensile stress from being released during subsequent processes.

An annealing process 99 is performed on the sidewall spacers 67" and 95" so as to repair damages formed in the PMOS 13 and NMOS 14 during previous etching processes. The annealing process 99 also utilizes the condition of the S/D anneal, wherein the temperature of the annealing process is the same as that of the annealing process 52.

By using the dual SMT, the channel region 78 obtains the compressive stress provided by the sidewall spacer 67"; and the channel region 88 obtains the tensile stress provided by the sidewall spacer 95". In addition, a correct type of stress layer imposes on a corresponding type of channel region so as not to suppress a carrier mobility of another type of channel region. The carrier mobility of both types is enhanced so that the current performance and speed can be improved.

Next, a silicidation for the source/drain regions (71, 72, 81, and 82) and the gate electrodes (75, 85) is performed. After the silicidation, a contact etch stop layer CESL (not shown) is formed over the PMOS 13 and the NMOS 14. The CESL is similar to previous capping layers such as the capping layer 67, which is made of dielectric material, for example, nitrides, oxides, oxynitride, tetra-ethyl-ortho-silicate (TEOS), other suitable materials, or combinations thereof. The CESL serves as an etching stop layer and a stress memorization layer at the same time. Later, an inter-level dielectric (ILD) layer is deposited over the semiconductor substrate 10. The ILD layer includes, for example, a layer of borophosphosilicate glass (BPSG). The ILD layer is then patterned to form contact holes above the source/drain regions and the gate electrodes. A contact metal layer is then filled in the contact holes so as to form contact plugs in contact with the source/drain regions and the gate electrodes.

Regarding the structure of the PMOS 13 specifically, a gate stack 73 is formed on the semiconductor substrate 10. The gate stack 73 includes a gate dielectric layer 74 over the semiconductor substrate 10 and a gate electrode 75 over the gate dielectric layer 74. A liner 76 is formed on a sidewall of the gate stack 73; and a dielectric layer 77 is formed on a sidewall of the liner 73. Thus, the dielectric layer 77 and the liner 76 are disposed between the gate stack 73 and a sidewall spacer 67". The sidewall spacer 67" refers to a stress memorization technology (SMT) sidewall spacer and provides a compressive stress for a channel region 78 beneath the gate stack 73. The sidewall spacer 67" includes a dielectric material different from the gate stack 73 and the semiconductor substrate 10. In addition, the sidewall spacer 67" is disposed laterally over a sidewall of the dielectric layer 77, wherein the sidewall spacer 67" interfaces with the dielectric layer 77 and the semiconductor substrate 10. In an embodiment, the liner 76 and the dielectric layer 77 are optional so that the sidewall spacer 67" is disposed over a sidewall of the gate stack 73. The sidewall spacer 67" interfaces with the gate stack 73 and the semiconductor substrate 10. Further, the sidewall spacer 67" overlaps a portion of the source/drain regions 71 and 72 adjacent to the gate stack 73, wherein the source/drain regions 71 and 72 are disposed in the semiconductor substrate 10. With the sidewall spacer 67", the carrier mobility in the channel region 78 is increased so that current and speed performance can be improved. The sidewall spacer 95" has a structure similar to the sidewall spacer 67".

In brief, a stress memorization technology (SMT) layer is utilized as a main sidewall spacer and provides a stress for the channel regions at the same time. The SMT layer is shaped as sidewall spacers and remains over the channel regions so as to maintain the stress for devices. Further, the remaining SMT layer enhances and maintains the stress introduced into the channel region. During subsequent processes, the stress in the channel region will be maintained but not released because of memorization of the remaining SMT layer. With the remaining SMT layer, speed and current performance of devices can be improved. Concerning the process, cycles of a nitride formation are reduced to one operation so as to reduce the cost of the manufacturing process. The formation of sidewall spacers is combined with the stress memorization technology (SMT). Due to one operation, the process window or margin becomes greater so that a yield can be improved and defects are reduced.

A semiconductor structure includes a semiconductor substrate; a gate stack on the semiconductor substrate; and a stress memorization technology (SMT) sidewall spacer over a sidewall of the gate stack. The gate stack includes a gate dielectric layer over the semiconductor substrate and a gate electrode over the gate dielectric layer. The SMT sidewall spacer provides a stress for a channel region beneath the gate stack.

In some embodiments, the SMT sidewall spacer includes a dielectric material different from the gate stack and the semiconductor substrate.

In some embodiments, the SMT sidewall spacer interfaces with the gate stack and the semiconductor substrate.

In some embodiments, the SMT sidewall spacer overlaps a portion of a source/drain region adjacent to the gate stack. The source/drain region is disposed in the semiconductor substrate.

In some embodiments, the semiconductor structure further includes a liner on the sidewall of the gate stack, wherein the liner is disposed between the gate stack and the SMT sidewall spacer.

In some embodiments, the semiconductor structure further includes a dielectric layer on a sidewall of the liner, wherein the dielectric layer is disposed between the gate stack and the SMT sidewall spacer.

A method for manufacturing a semiconductor structure includes: forming a gate stack over a semiconductor substrate and a source/drain region adjacent to the gate stack; forming a capping layer over the gate stack and the semiconductor substrate; annealing the capping layer and the semiconductor substrate so as to recrystallize and deform a gate electrode of the gate stack; and removing a portion of the capping layer, thereby forming a sidewall spacer around the gate stack. The deformed gate electrode transfers the stress into a channel region beneath the gate stack.

In some embodiments, the method further includes performing a pre-amorphization implant so as to amorphorize the gate electrode and the source/drain region.

In some embodiments, the method further includes annealing a remaining portion of the capping layer.

In some embodiments, removing the capping layer includes a dry etching process.

In some embodiments, the method further includes forming an oxide layer over the semiconductor substrate, wherein the oxide layer serves as an etch stop layer and protects the gate stack.

In some embodiments, the method further includes implanting ions on the capping layer.

In some embodiments, the method further includes forming a liner conformally on the gate stack; and forming a dielectric layer on the liner. The liner interfaces the sidewall of the gate stack and the semiconductor substrate.

In some embodiments, the method further includes forming a metal layer over the gate stack and the source/drain region; annealing the metal layer so as to partially silicide the gate stack and the source/drain region; and removing an unreacted metal layer.

In some embodiments, the method further includes forming a contact etch stop layer over the semiconductor substrate.

In some embodiments, the method further includes forming a gate dielectric layer over the semiconductor substrate; forming a gate electrode layer over the gate dielectric layer; patterning the gate dielectric layer and the gate electrode layer so as to form the gate stack; and implanting ions into the semiconductor substrate so as to form the source/drain region adjacent to the gate stack.

A method for manufacturing a semiconductor device includes providing a semiconductor substrate including a first transistor with a first type and a second transistor with a second type, the first transistor including a first gate electrode and the second transistor including a second gate electrode; implanting ions on the semiconductor substrate so as to amorphorize the first and second gate electrodes; forming a compressive capping layer over the first and second transistors; removing the compressive capping layer above the second transistor, thus forming a patterned compressive capping layer over the first transistor and exposing the second transistor; forming a tensile capping layer over the second transistor and the patterned compressive capping layer; removing the tensile capping layer above the first transistor, thus forming a patterned tensile capping layer over the second transistor; annealing the patterned tensile capping layer and the patterned compressive capping layer so as to recrystallize and deform the first and second gate electrodes; and removing portions of the patterned tensile capping layer and the patterned compressive capping layer, thereby forming sidewall spacers around the first and second gate electrodes. The deformed first gate electrode transfers a compressive stress into a channel region beneath the first gate electrode. The deformed second gate electrode transfers a tensile stress into a channel region beneath the second gate electrode.

In some embodiments, the method further includes annealing the sidewall spacers.

In some embodiments, the method further includes forming an etch stop layer over the compressive capping layer; forming a patterned mask layer over the first transistor; removing the etch stop layer above the second transistor; and removing the patterned mask layer.

In some embodiments, the method further includes forming a patterned mask layer over the second transistor; and removing the patterned mask layer. The patterned mask layer covers the tensile capping layer over the second transistor and exposes the tensile capping layer over the first transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
   forming a gate stack over a semiconductor substrate and a source/drain region adjacent to the gate stack;
   forming a capping layer over the gate stack and the semiconductor substrate;
   implanting ions on the capping layer;
   annealing the capping layer and the semiconductor substrate so as to recrystallize and deform a gate electrode of the gate stack, wherein the deformed gate electrode transfers the stress into a channel region beneath the gate stack; and
   removing a portion of the capping layer, thereby forming a sidewall spacer around the gate stack.

2. The method of claim 1, further comprising:
   performing a pre-amorphization implant so as to amorphorize the gate electrode and the source/drain region.

3. The method of claim 1, further comprising:
   annealing a remaining portion of the capping layer.

4. The method of claim 1, wherein removing the capping layer comprises a dry etching process.

5. The method of claim 1, further comprising:
   forming an oxide layer over the semiconductor substrate, wherein the oxide layer serves as an etch stop layer and protects the gate stack.

6. The method of claim 1, further comprising:
   forming a liner conformally on the gate stack, wherein the liner interfaces the sidewall of the gate stack and the semiconductor substrate; and
   forming a dielectric layer on the liner.

7. The method of claim 1, further comprising:
   forming a metal layer over the gate stack and the source/drain region;
   annealing the metal layer so as to partially silicide the gate stack and the source/drain region; and
   removing an unreacted metal layer.

8. The method of claim 1, further comprising:
   forming a contact etch stop layer over the semiconductor substrate.

9. The method of claim 1, further comprising:
forming a gate dielectric layer over the semiconductor substrate;
forming a gate electrode layer over the gate dielectric layer;
patterning the gate dielectric layer and the gate electrode layer so as to form the gate stack; and
implanting ions into the semiconductor substrate so as to form the source/drain region adjacent to the gate stack.

10. The method of Claim 1, the implanting ions on the capping layer comprises:
implanting ions of xenon, As, Ge, or In on the capping layer.

11. The method of claim 6, wherein the liner is formed as an L-shape in a cross-sectional view.

12. A method for manufacturing a semiconductor structure, comprising:
forming a gate stack over a semiconductor substrate and a source/drain region adjacent to the gate stack;
forming an oxide layer over the semiconductor substrate;
forming a capping layer over the gate stack and the semiconductor substrate;
implanting ions on the capping layer;
annealing the capping layer and the semiconductor substrate so as to recrystallize and deform a gate electrode of the gate stack, wherein the deformed gate electrode transfers the stress into a channel region beneath the gate stack; and
removing a portion of the capping layer, thereby forming a sidewall spacer around the gate stack;
wherein the oxide layer is formed prior to the capping layer.

13. The method of claim 12, wherein the oxide layer serves as an etch stop layer and protects the gate stack and the source/drain region.

14. The method of claim 12, further comprising:
thinning down a portion of the capping layer.

15. A method for manufacturing a semiconductor structure, comprising:
forming a gate stack over a semiconductor substrate and a source/drain region adjacent to the gate stack;
forming a capping layer over the gate stack and the semiconductor substrate;
implanting ions on the capping layer;
annealing the capping layer and the semiconductor substrate;
etching a portion of the capping layer to form a sidewall spacer around the gate stack, wherein the sidewall spacer includes a lattice constant different from that of a gate electrode of the gate stack or the source/drain region;
forming a metal layer over the gate stack and the source/drain region; and
annealing the metal layer so as to partially silicide the gate stack and the source/drain region.

16. The method of claim 15, wherein the capping layer includes dielectric material.

17. The method of claim 15, further comprising:
annealing the sidewall spacer around the gate stack.

18. The method of claim 15, wherein the forming a metal layer over the gate stack and the source/drain region comprises:
forming the metal layer having a thickness of about 6 angstroms to about 8 angstroms over the gate stack and the source/drain region.

19. The method of claim 15, further comprising:
removing an unreacted metal layer.

* * * * *